United States Patent [19]
Pals et al.

[11] Patent Number: 4,831,425
[45] Date of Patent: May 16, 1989

[54] INTEGRATED CIRCUIT HAVING IMPROVED CONTACT REGION

[75] Inventors: Jan A. Pals, Eindhoven; Arend J. Klinkhamer, Nijmegen, both of Netherlands

[73] Assignee: U.S. Philips Corp., New York, N.Y.

[21] Appl. No.: 5,807

[22] Filed: Jan. 22, 1987

Related U.S. Application Data

[62] Division of Ser. No. 649,633, Sep. 12, 1984, Pat. No. 4,686,759.

[30] Foreign Application Priority Data

Sep. 23, 1983 [NL] Netherlands .......................... 8303268

[51] Int. Cl.[4] ...................... H01L 29/78; H01L 29/34; H01L 29/04; H01L 29/62
[52] U.S. Cl. ........................... 357/24; 357/54; 357/59; 357/71
[58] Field of Search ................ 357/24, 54, 59 G, 59 J, 357/71

[56] References Cited

U.S. PATENT DOCUMENTS

| | | | |
|---|---|---|---|
| 3,943,543 | 3/1976 | Caywood | 357/24 |
| 3,961,352 | 6/1976 | Colton et al. | 357/24 |
| 4,262,297 | 4/1981 | Patridge | 357/59 J |
| 4,306,353 | 0/1981 | Jacobs et al. | 29/571 |

FOREIGN PATENT DOCUMENTS 56-10930 2/1981 Japan .

OTHER PUBLICATIONS

Beck, G. A. et al., "High Density Frame Transfer Image Sensor", *Proc. of the 14th Conf.* (1982 *Int'l.*) on *Solid State Devices*, Tokyo, 1982, *Jap. J. App. Phys.*, vol. 22 (1983), Supp. 22-1, pp. 109-112.

*Primary Examiner*—Gene M. Munson
*Attorney, Agent, or Firm*—William L. Botjer

[57] ABSTRACT

Method of manufacturing a semiconductor device and semiconductor device manufactured by the use of such a method.

The invention describes a method of contacting narrow regions, such as narrow polysilicon gates of a CCD having a width of, for example, 4 μm. Poly 2 and poly 3 layers, which are required already for the other CCD phases, are used as etching masks having two contact openings of 4 μm which are displaced both with respect to each other and with respect to the region to be contacted, so that it is possible to define a contact opening which is smaller than 4 μm and is aligned accurately above the gate to be contacted. FIG. 4.

8 Claims, 3 Drawing Sheets

INTEGRATED CIRCUIT HAVING IMPROVED CONTACT REGION

CROSS REFERENCE TO RELATED APPLICATION

This applicataion is a division of application Ser. No. 649,633 filed Sept. 12, 1984 now U.S. Pat. No. 4,686,759 issued Aug. 18, 1987.

BACKGROUND OF THE INVENTION

The invention relates to a method of manufacturing an integrated circuit. The integrated circuit comprises a semiconductor body which is provided at a surface with a multilayer electrode system. The system of electrodes has at least three layers, which are referred to hereinafter as the first, second and third electrode layers. The electrode layers are successively provided on the semiconductor body, and are separated from each other by insulating layers.

A contact is formed between the third electrode layer and a region which forms part of the integrated circuit. The region of the integrated circuit is defined already before the first electrode layer is provided. This region is covered with a dielectric layer which extends above the region and beyond the edges of the region above the surface of the semiconductor body. A contact window is defined in the dielectric layer for the contact.

The first and second electrode layers may consist, for example, of polycrystalline silicon. The third electrode layer may consist of a pattern of Al. If desired, the polycrystalline silicon may then be further converted into a silicide by alloying it with a suitable material.

The insulating layers between the electrode layers may consist of silicon oxide obtained by oxidation of the polycrystalline silicon.

Suitable materials other than polycrystalline silicon, such as for example Mo or Al, may alternatively be used for the first and second electrode layers.

The region which is contacted by the third electrode layer may be a diffused zone in the semiconductor body. However, in many cases this region will consist of a part of an electrode layer which is provided before (under) the first electrode layer. Such a contact region may be, for example, a gate electrode of an insulated gate field effect device, such as a field effect transistor or a charge coupled device.

Due to the tendency to increasingly reduce the lateral dimensions of integrated circuits, the step of providing the contact window in the dielectric layer, mostly an oxide layer, is very critical. When no additional measures are taken, it often occurs that due to misalignment or due to an excessively long etching treatment, not only the oxide above the region to be contacted, but also oxide beside this region is removed. As a result, a short circuit is produced when the Al contact is provided.

In certain cases, for example when the region to be contacted has a width of about 4 $\mu$m and the contact window also has a width of about 4 $\mu$m, it is practically impossible to manufacture useable circuits with a reasonable yield due to the misalignment problem without taking additional measures. In general, it is not possible to provide a contact when the region to be contacted is smaller than the sum of the smallest contact hole on the mask, the underetching distance and the alignment tolerance.

When the region to be contacted consists of an underlying polysilicon or metal layer, the problem described above can be avoided by using a so-called etching barrier in the form of a silicon nitride layer under the polysilicon or metal. The silicon nitride then extends beyond the edges of the region to be contacted. Such a method is described, inter alia, in U.S. Pat. No. 4,306,353. A disadvantage of this known method is that it usually requires a change in the process of making the circuit. This known method will usually require the production of an additional nitride layer. As a result, the process, which is already complicated, will comprise even more steps.

SUMMARY OF THE INVENTION

It is an object of the invention to provide a method of manufacturing an integrated circuit in which undesired short circuits due to too large or misaligned contact windows are avoided without requiring additional processing steps.

The invention is based, inter alia, on the recognition of the fact that the edges of the contact region will always be covered when an etching barrier is provided in two layers which each cover only one edge of the contact region, while dimensions less than 4 $\mu$m are not required at any area of the mask. The invention is further based on the recognition of the fact that these layers can be provided simultaneously with the first and second electrode layers.

According to the invention, the area of the contact to be provided a first pattern of the same material as the first electrode layer is formed simultaneously with the first electrode layer. This material can be etched selectively with respect to the dielectric layer and covers a first edge of the contact region. A second pattern of the same material as the second electrode layer is formed simultaneously with the second electrode layer. This material can also be etched selectively with respect to the dielectric layer and covers a second edge of the contact region located opposite to the first edge. Then, while using a mask comprising the first and second patterns, the contact window is provided in the dielectric layer.

When using the first and second electrode layers at two opposite edges of the region to be contacted, a very small contact opening can be provided in the dielectric layer above the region to be contacted. At the same time, features having larger dimensions can be provided in the first and second electrode layers.

In a preferred embodiment of the method, which avoids completely covering the contact due to misalignment of the first and/or second pattern a second contact is formed between the third electrode layer and the contact region. For this purpose, a third pattern covering the second edge of the second contact region is formed in the first electrode layer simultaneously with the first pattern. A fourth pattern covering the first edge of the second contact region is formed in the second electrode layer simultaneously with the second pattern. Simultaneously with the first contact window, a second contact window is formed in the dielectric layer by using an etching mask comprising the third and fourth patterns.

The invention further relates to a semiconductor device comprising an integrated circuit manufactured at the surface of a semiconductor body. A multilayer electrode system comprising successive first, second and third electrode layers separated from each other by insulating layers is provided on the surface of the body.

A contact is formed between the third electrode layer and a region of the integrated circuit. The contact region is formed before the first electrode layer is provided. The contact region is covered with a dielectric layer which extends above the contact region and above the surface of the semiconductor body beyond the edges of the contact region. A contact window is formed in the dielectric layer.

In such a semiconductor device according to the invention, at the area of the contact a first pattern is formed. The first pattern consists of the same material as the first electrode layer. This material can be etched selectively with respect to the dielectric layer, and it covers a first edge of the contact region. A second pattern is formed which consists of the same material as the second electrode layer which can also be etched selectively with respect to the dielectric layer. The contact window and the dielectric layer is defined by the space between the first and the second patterns.

The invention is of particular importance in the manufacture of charge coupled devices, such as two-dimensional image sensors, in which elongate narrow clock electrodes on either side of the array are connected to clock lines. It is then generally necessary that the clock electrodes of at least one clock line contact an overlying Al layer. The invention also relates to a camera provided with such a sensor.

DESCRIPTION OF THE PREFERRED EMBODIMENTS

Figure 1:
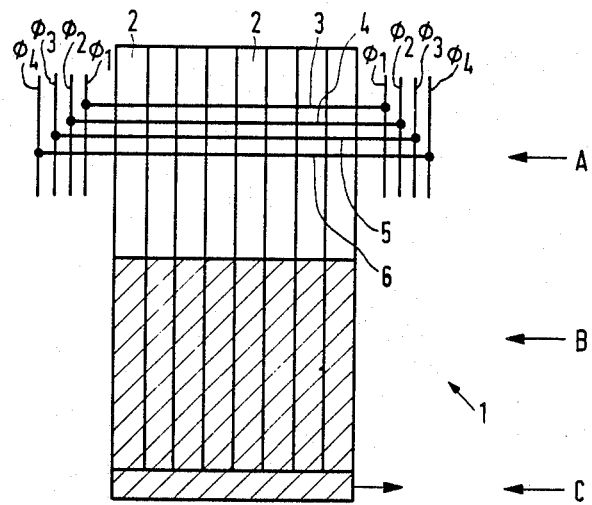
FIG. 1 schematically shows the circuit diagram of a charge coupled image sensor of the frame transfer type, in which the invention is used.

The invention will be described with reference to a CTD image sensor, the principle circuit diagram of which is shown in FIG. 1. The sensor is of the generally known frame transfer (F.T.) type and comprises a large number of CCD channels 2 extending in the vertical direction (columns).

The unshaded part A of the sensor is the pickup portion, onto which an image can be projected, and in which the image can then be converted into charge packets. The shaded part B of the sensor is the storage portion, in which the mosaic of charge packets produced in A can be stored. In order to avoid changing the stored information due to incident radiation, the storage portion may be provided with a reflecting or absorbing screening layer.

The stored charge can be read by the horizontal register C. The information stored in B is transferred line by line to register C.

For a description in greater detail of such a sensor, reference may be made to the article by G. A. Beck et al entitled "High Density Frame Transfer Image Sensor" *Proceedings of the 14th Conf.* (1982 *International*) on *Solid State Device,* Tokyo, 1982. *Japanese Journal Appl. Phys,* Vol. 22, (1983). Suppl. 22-1, pp. 109–112).

FIG. 1 shows four clock electrodes of the image sensor device, which, by way of example, is a four phase device. Each of these clock electrodes, 3, 4, 5 and 6 is driven via a clock line by one of the clock voltages $\phi_1 - \phi_4$.

Due to the large number of columns 2 (generally at least a few hundred), the clock electrodes can become very long. Due to the fact that the widths of these clock electrodes are also preferably very small, and due to the fact that doped polycrystalline silicon is used for the clock electrodes, the clock electrodes may exhibit high resistances if they are driven from one side. In order to avoid excessively high resistances, the clock electrodes can be connected to clock lines on both sides of the array.

In the case in which the clock electrodes 3–6 are provided in four electrode levels, for example four layers of polycrystalline silicon, each clock line can be a rib or sleeve in the same polycrystalline silicon layer as the associated clock voltage electrode $\phi$. In the case in which only three polycrystalline silicon layers are available, this construction is no longer possible because at least two clock voltage electrodes must be provided in the same polycrystalline silicon layer.

Figure 2:
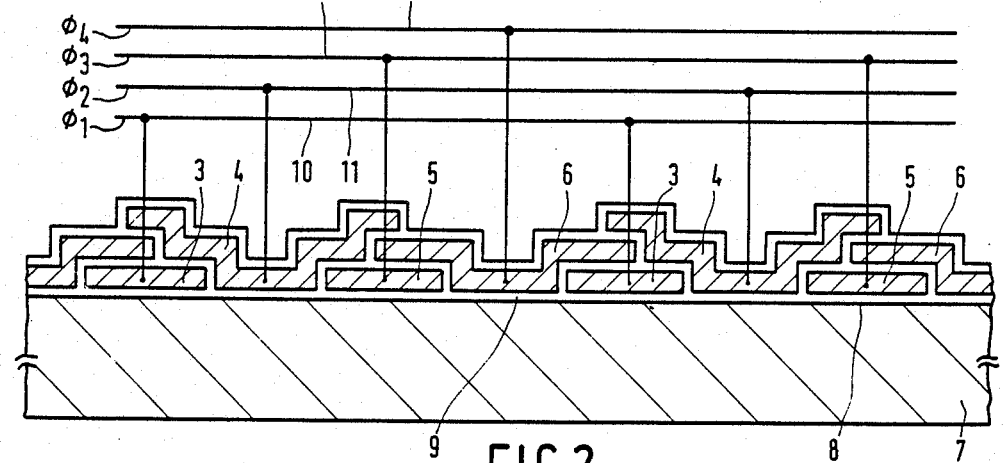
FIG. 2 is a longitudinal sectional view of a part of the device of FIG. 1.

FIG. 2 shows a cross-section along a charge transport channel of the three-layer polycrystalline silicon structure. The charge transport channel 2 is defined in the semiconductor body 7 and may be either a surface channel or a buried channel device. The surface 8 of the body 7 is coated with a thin oxide layer 9 which forms the gate dielectric of the device.

The electrodes 3 and 5 are both provided in the lowermost polycrystalline silicon layer, and are connected to the clock lines 10 and 12, respectively. Lines 10 and 12 supply, the clock voltages $\phi_1$ and $\phi_3$, respectively. The clock electrodes 4 and 6 and the associated clock lines 11 and 13, respectively, are provided in the third layer and in the second layer, respectively. The different electrode levels are separated from each other by an insulating oxide layer.

The clock electrodes 3 can be connected in the same manner on either side of the matrix to the clock line 10, which is in the same layer as electrodes 3. The clock electrodes 5, also in the same layer, have a number of loose strips which are interdigitated with the electrodes 3 and contact a higher wiring layer.

Figure 3:
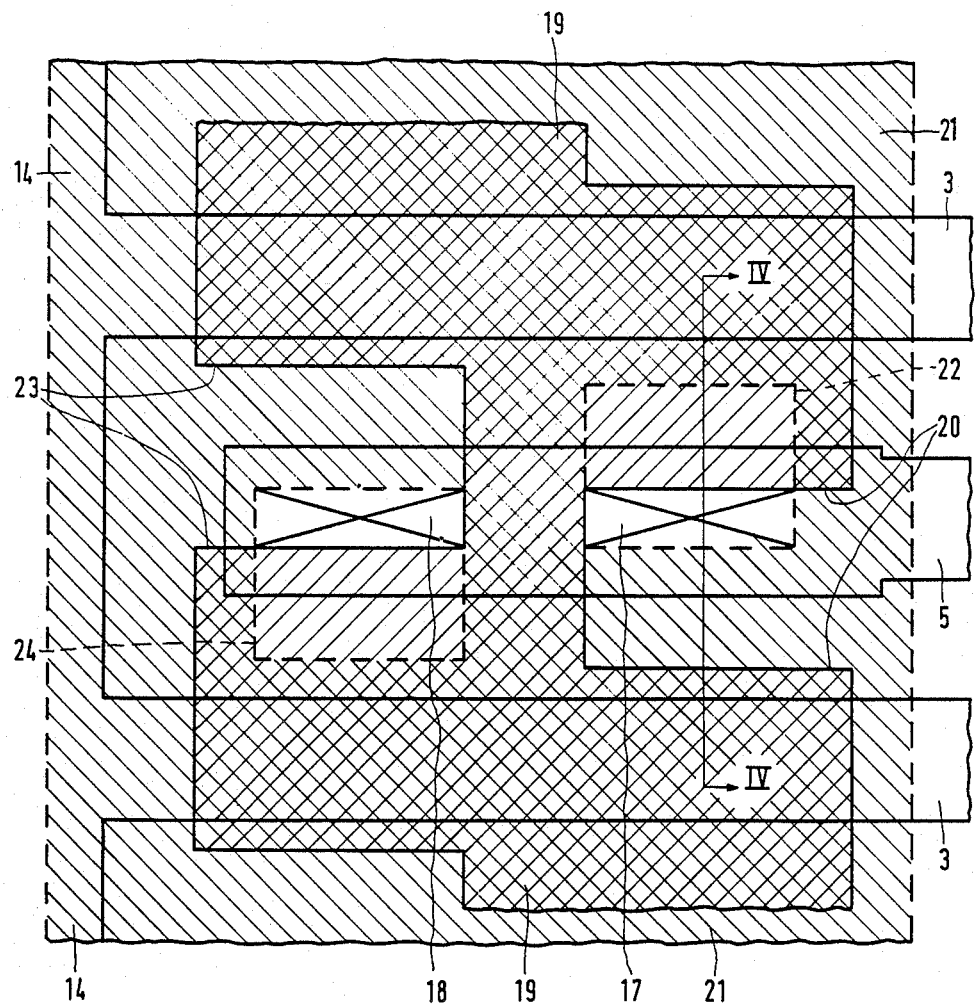
FIG. 3 is a plan view of the contact regions of a device according to the invention.

FIG. 3 is a plan view of a part of the device located at the left hand edge of the sensor outside the active region.

Figure 4:
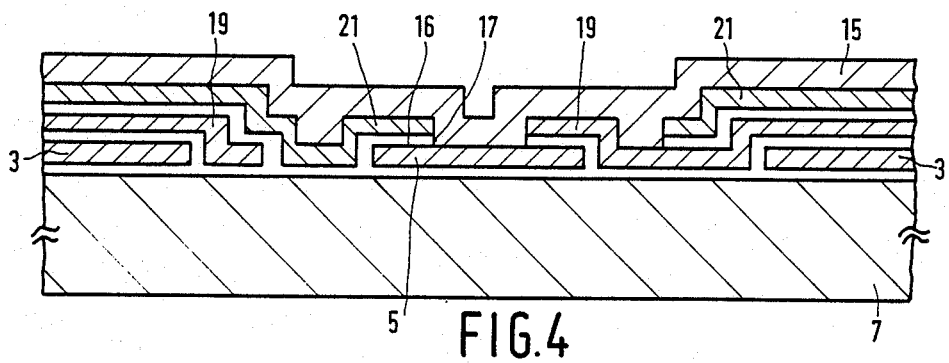
FIG. 4 is a cross-sectional view on the line IV—IV in FIG. 3.

FIG. 4 is a sectional view of the part of the device shown in FIG. 3 taken on the line IV—IV. In the drawing, two electrodes 3 and an intermediate electrode 5 are shown. The electrodes 4 and 6 are no longer shown in this Figure, but should be assumed to be located with their clock lines on the right hand side outside the part shown in the drawing. The electrodes 3 are connected to each other by a clock line 10 formed by the rib 14 in FIG. 3. On the right hand side of the sensor, the electrodes 3 are connected to each other by a similar rib.

The electrodes 5 are connected to each other by an Al strip 15 (FIG. 4). Strip 15 connects the electrodes 5 and serves as a clock line 12.

For the contact between the electrode 5 and the Al strip 15, a contact window 17 is provided in the dielectric layer 16 which covers the electrode 5. Layer 16 also extends beyond the electrode 5 above the surface 8 of the substrate 7. In FIG. 3, in which the Al strip 15 is not shown for the sake of clarity, the contact opening 17 is marked by a criss-cross (as is the contact opening 18 which will be referred to hereinafter).

The contact window 17 is defined by two patterns which are formed simultaneously with first and second overlying electrode layers, respectively. In the present embodiment, the patterns are formed in the second and in the third polycrystalline silicon layers, respectively.

The first pattern 19, shaded in the drawing from the upper right hand side to the lower left hand side, has an opening 20. Opening 20 is so displaced with respect to the electrode 5 that an edge, i.e. the right hand edge in FIG. 4, is covered. The left hand edge of the electrode 5 is uncovered.

The second pattern 21 is formed in the third polycrystalline silicon layer and is shaded in the drawing from the upper left hand side to the lower right hand side. The second pattern 21 is also provided with an opening 22 which is arranged so that now the left hand edge of the electrode 5 is covered, but the right hand edge of the electrode 5 is located inside the opening 22.

Above the electrode 5, the patterns 19 and 21 form an opening which defines the contact window 17 to be formed in the oxide layer 16. The edges of the electrode 5 are each covered by polycrystalline silicon. Due to the fact that the oxide layer 16 can be etched selectively with respect to the polycrystalline silicon, the window 17 will rarely overlap the edges of the electrode 5 due to excessive etching or misalignment.

In order to avoid failure due to the window 17 becoming too small (or even closing completely) due to providing the pattern 19 too far to the left hand side (FIG. 4) and/or providing the pattern 21 too far to the right hand side, a second contact window 18 (see FIG. 3) is provided beside the first contact window 17. The contact window 18 is defined by a third pattern having an opening 23 (FIG. 3) which does not cover the upper edge of the electrode 5 in FIG. 3, and a fourth pattern having an opening 24 which does not cover the lower edge of the electrode 5. The third and fourth patterns can be provided in separate polycrystalline silicon layers.

In the present embodiment, the third and fourth patterns form with the first and the second pattern, respectively, common coherent layer parts in the second and third polycrystalline silicon layers 19 and 21, respectively. When due to misalignment the contact window 17 becomes too small or too large, the contact window 18 will become too large or too small, respectively, to practically the same extent. The overall contact surface area will therefore be practically constant, and will be substantially entirely defined by the mask dimensions.

Figure 5:
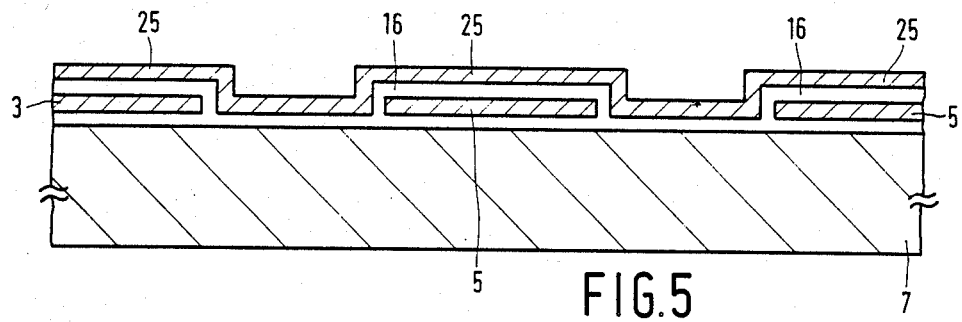
FIGS. 5-8 show the cross-section of FIG. 4 at different stages of manufacture.

FIGS. 5-8 show a few processing steps in the manufacture of the device. FIG. 5 shows the device at a stage at which the electrodes 3 and 5 are defined in the first polycrystalline silicon layer, and in which a continuous second layer 25 is formed on the surface of the body. The layer 25 is separated from the electrodes 3 and 5 by the intermediate oxide layer 16. The oxide layer 16 may be obtained in known manner by oxidation of the electrodes 3 and 5, but may of course alternatively be formed by CVD techniques.

The widths of the electrodes 3 and 5 are about 4 μm. The distances between the electrodes are about 3 μm.

Figure 6:
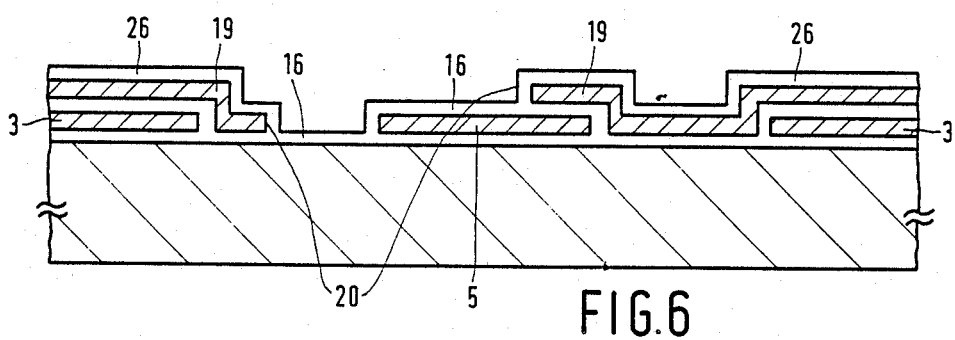
Figure 7:
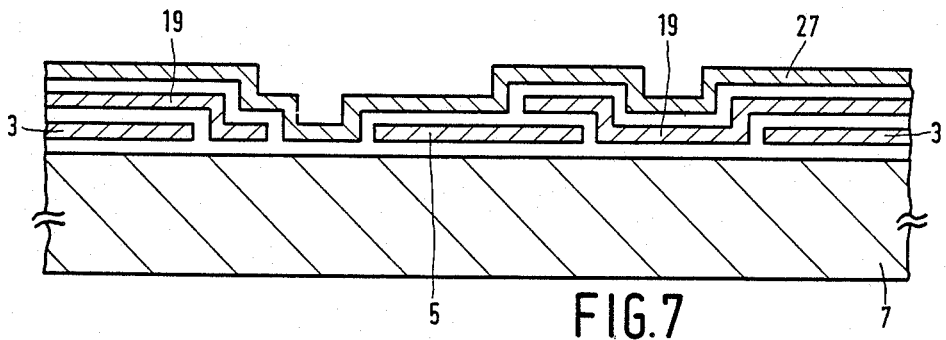

In the usual manner, the electrodes 6 are formed from the layer 25. Simultaneously with this processing step, the patterns 19 with the windows 20 and 23 are formed in the layer 25 (FIG. 6).

The widths of these windows 20 and 23 are about 4 μm. The window 20 is so situated with respect to the electrode 5 that the right hand edge of the electrode 5 is overlapped by the pattern 19 over a distance about equal to the alignment tolerance, whereas the opposite edge is exposed. In the same manner, and opening 23 (not shown in FIG. 6), is so situated that the left hand edge of the electrode 5 is overlapped by the pattern, whereas the right hand edge is exposed.

After the electrodes 6 and the pattern 19 have been formed in the second layer, the exposed layer can be coated with an oxide layer 26 by an oxidation step.

It should be noted that the pattern 19 with the windows 20 and 23 can be formed by a selective etching treatment, in which the polycrystalline silicon is removed much more rapidly than the silicon oxide of the layer. Therefore, even if the opening 20 extends over the right hand edge of the electrode 5, nevertheless no undesired short circuits will be produced. For this purpose, the second layer can be patterned, preferably, by a wet etch of a solution of $HNO_3$ to which a very small quantity of HF is added.

In the next step (FIG. 7), a third polycrystalline silicon layer 27 is formed by the same selective etching treatment described above. Electrodes 4 are formed in the third layer. Simultaneously, the second pattern 21 with the window 22 (FIG. 8) is formed from the third layer 27. The window 22 is so displaced with respect to the previously provided window 20 that the pattern 21 overlaps the left hand edge of the electrode 5 but does not cover the right hand edge.

Simultaneously, a window 24 (not shown in FIG. 7, but shown in FIG. 3) is provided in the pattern 21. Window 24 is displaced with respect to the window 22. With the window 22, windows 24 form an opening over electrode 5.

The pattern 21 can be provided by the same etching technique as the pattern 19. The oxide layer 16, which covers the electrode 5, is not or is substantially not attacked.

Figure 8:
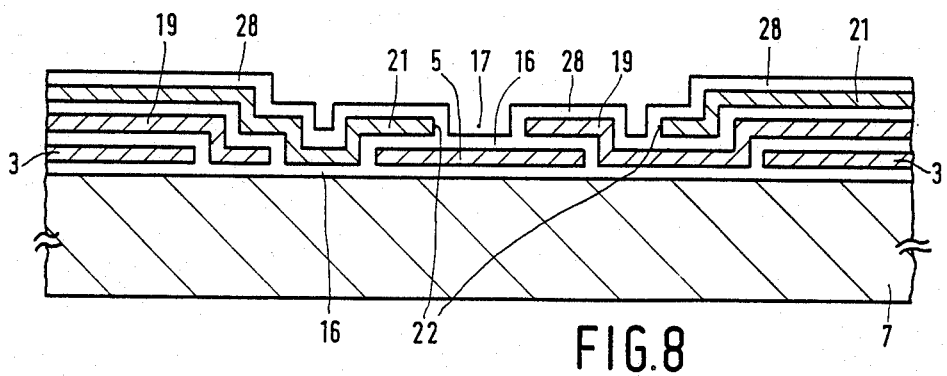

As can be seen in FIG. 8, the patterns 19 and 21 together form a mask which defines the contact window 17. Before the windows 17 and 18 are opened, the oxide covering the electrodes is masked by a photolacquer layer. Subsequently, the oxide 16 in the window 17 is removed in a manner known per se.

The oxide layers 28 covering the patterns 19 and 21 (FIG. 8) are then also removed. However, if desired, the oxide layer 28 on the patterns 19 and 21 may be maintained at least in part during the etching treatment by marking the oxide 28 by a mask which need not be critically aligned with respect to the window 17. Due to the fact that the edges of the electrode 5 are masked by the patterns 19 and 21 during etching, there is substantially no risk of the oxide 16 beside the electrode 5 attacked, which would lead to the formation of undesired short circuits.

The widths of the window 17 is about 2 μm, (with a 4 μm wide electrode 5). The width of the window 17 is not critical. In the case in which the window 17 is smaller than 2 μm, the width of the window 18 will become larger than 2 μm. If, on the other hand, the window 18 is smaller than 2 μm, the width of the window 17 will be larger than 2 μm. The overall contact surface area will therefore be substantially entirely defined by a mask and will be independent of alignment tolerances.

After the windows 17 and 18 have been opened, the Al contact layer 15 can be provided. Layer 15 contacts, via the windows 17 and 18, the electrodes. As a result, the structure shown in FIG. 4 is obtained.

Finally, the device may be subjected to further usual processing steps, such as the step of forming a passivation layer and the step of providing the device in an envelope.

It will be clear that the invention is not limited to the embodiment described herein, but that many further variations are possible for those skilled in the art without departing from the scope of the invention. Thus, instead of polycrystalline silicon, other materials may be used for the various electrodes.

What is claimed is:

1. An integrated circuit comprising:
    a semiconductor body having a surface and a contact region on the surface, said contact region having first and second opposite edges;
    a first dielectric layer on the surface of the body, said first dielectric layer covering the contact region and its edges;
    a first electrode layer on the first dielectric layer, said first electrode layer covering the first edge of the contact region;
    a second dielectric layer on the first electrode layer;
    a second electrode layer on the second dielectric layer and on exposed portions of the first dielectric layer, said second electrode layer covering the second edge of the contact region, said first and second electrode layers forming a mask with an opening over the contact region; and
    a contact window in the first dielectric layer beneath the opening in the mask.

2. An integrated circuit as claimed in claim 1, characterized in that each electrode layer comprises at least two separate portions, at least one of which functions solely as a mask.

3. An integrated circuit as claimed in claim 2, characterized in that the electrode layers and the dielectric layers are selectively etchable with respect to each other.

4. An integrated circuit as claimed in claim 3, characterized in that the body comprises:
    a semiconductor body coated with a thin oxide layer; and
    a gate electrode on the oxide layer, a portion of said gate electrode forming the contact region.

5. An integrated circuit as claimed in claim 1, characterized in that:
    the body has first and second contact regions, each contact region having first and second opposite edges, both first edges being on a corresponding side of both contact regions, both second edges being on an opposite corresponding side of both contact regions;
    the first electrode layer covers the first edge of the first contact region and the second edge of the second contact region;
    the second electrode layer covers the second edge of the first contact region and the first edge of the second contact region, said first and second electrode layers forming a mask with openings over the first and second contact regions; and
    the dielectric layer is removed over both contact regions to form contact windows in the first dielectric layer beneath the openings in the mask.

6. An integrated circuit as claimed in claim 5, characterized in that
    the first electrode layer does not cover the second edge of the first contact region or the first edge of the second contact region; and
    the second electrode layer does not cover the first edge of the first contact region or the second edge of the second contact region.

7. An integrated circuit as claimed in claim 6, characterized in that the electrode layers comprise polycrystalline silicon.

8. An integrated circuit as claimed in claim 7, characterized in that the first and second electrodes are arranged in rows to form the gate electrodes of a charge coupled device.

* * * * *